United States Patent [19]

Ketley

[11] 3,867,150

[45] Feb. 18, 1975

[54] PRINTING PLATE PROCESS AND APPARATUS USING A LASER SCANNED SILVER NEGATIVE

[75] Inventor: Arthur D. Ketley, Columbia, Md.

[73] Assignee: W. R. Grace & Co., New York, N.Y.

[22] Filed: June 8, 1973

[21] Appl. No.: 368,170

[52] U.S. Cl. .................... 96/36.3, 96/27 H, 96/35.1

[51] Int. Cl. .................... G03c 5/00

[58] Field of Search ....... 96/36.3, 27 H, 115 P, 35.1

[56] References Cited

UNITED STATES PATENTS

| | | | |
|---|---|---|---|
| 3,506,779 | 4/1970 | Brown | 96/27 H |
| 3,549,733 | 12/1970 | Caddell | 96/36.3 |
| 3,645,730 | 2/1972 | Frank et al. | 96/28 |
| 3,647,446 | 3/1972 | Alsup et al. | 96/36.3 |
| 3,723,121 | 3/1973 | Hauser | 96/27 H |

OTHER PUBLICATIONS

Marchant et al., Defensive Publication, T877,006, Published Aug. 18, 1970, 877 O.G. 490.

*Primary Examiner*—J. Travis Brown
*Attorney, Agent, or Firm*—Lowell Gene Wise; Kenneth E. Prince

[57] ABSTRACT

This invention is directed to a process and apparatus for forming surfaces in relief such as a printing plate comprising employing a scanning laser to form an optical mask by forming opaque areas in an essentially transparent dry silver sheet, subjecting the exposed sheet to heat to develop the latent image, the resulting optical mask being used for imaging on a photosensitive printing plate using a conventional non-coherent UV light source.

2 Claims, 5 Drawing Figures

PRINTING PLATE PROCESS AND APPARATUS USING A LASER SCANNED SILVER NEGATIVE

This invention is directed to a method and apparatus for making surfaces in relief such as a letterpress printing plate. More particularly, this invention relates to a method and apparatus for using coherent radiation from a laser source to form an optical mask, which can be used for imaging on a photosensitive printing plate using a non-coherent UV light source.

Present day methods of forming printing plates involve the use of computers. However such systems have certain drawbacks. For instance when computers are used, the computer output goes to a phototypesetting station, which generates paragraphs of type. These paragraphs are pasted on a board along with half-tone pictures made by conventional means. The paste-up is then photographed to make a camera negative. The negative is developed by conventional wet processing development means and the developed negative is then used for imaging a photosensitive printing plate. Such a series of steps requires approximately ½ to 1 hour to make a plate.

By the method and apparatus of the present invention a new method of rapidly making optical masks of printed pages which can be transmitted from distant points has been devised. With this method, a typical newspaper page transmitted by means of a high capacity transmission channel can be reproduced in just seconds. Even over an ordinary telephone line this same operation would take about 4 minutes. Development requires only a short heating period. Furthermore using conventional techniques one can make paper copies from the optical mask or the optical mask could also be used as a permanant record.

The system uses a continuous wave laser of modulated intensity to record images on frames of transparent dry silver film having an essentially panchromatic response from the blue-green to the red portion of the spectrum. The laser creates a latent silver image in the essentially transparent silver film which is developed by the application of heat.

By modulating the laser beam, a latent image (reversed relative to the paste-up) can be formed on the film corresponding to type or to dots in half-tone image areas. To produce readable images of an original 16 inch × 24 inch document such as a newspaper page, 10,000 lines with approximately 6,000 spots in each line are used per frame of film. One frame therefor consists of about 60 million discrete sites where the latent image may or may not be present in the film.

The latent image when heated gives rise to an opaque site. For example in a frame of a printed document, individual letters consist of a pattern of clear dots on a silver background. In a typical recording operation, each laser beam pulse is focused onto a small region of the film which corresponds to a white area of the paste-up. A latent image is formed in this area which is converted by heat to an opaque silver mask.

A rotating polygon mirror, galvanometer mirrors, electro-optic and acousto-optic deflectors can be used to scan the light generated by the laser from left to right along a line across the width of the film. The pulse rate is between about 1 Hz and 1 MHz. Each pulse falls upon a spot adjacent to the spot associated with the preceding pulse. The dry silver film is moved at substantially constant speed along its length so that successive lines of spots are generated nearly adjacent to one another from the top of an image to the bottom. In an alternate arrangement the film is maintained stationary while the mirror drive mechanism is moved relatively to produce the slow scan along the direction of the film.

The key components in the apparatus used herein include a continuous wave or pulsed laser and an acousto-optic modulator which creates very short high power pulses of light from the laser.

In one apparatus, pulses from a 5,145 Angstrom argon-ion laser are incident upon the dry silver film at a rate of 1.5 MHz with a short period between writing successive lines when no pulses are incident upon the film. The total time required to write each frame is about 50 seconds.

The recording medium is a silver photographic film in which the processing chemicals are already incorporated. The silver halide is encapsulated so that contact between the halide and the chemical developing material is precluded at room temperature. Processing is achieved by heating the film which releases the silver halide from its encapsulant.

One object of the instant invention is to produce a process for making a printing plate that goes directly from the computer output to the plate-making step thereby eliminating all camera work and photocomposition. Another object of the instant invention is to reduce the pollution problem caused by wet development processing which is necessary to form a camera negative.

Other and further objects of the present invention will be apparent from the following detailed description of the accompanying drawings wherein.

Figure 2:
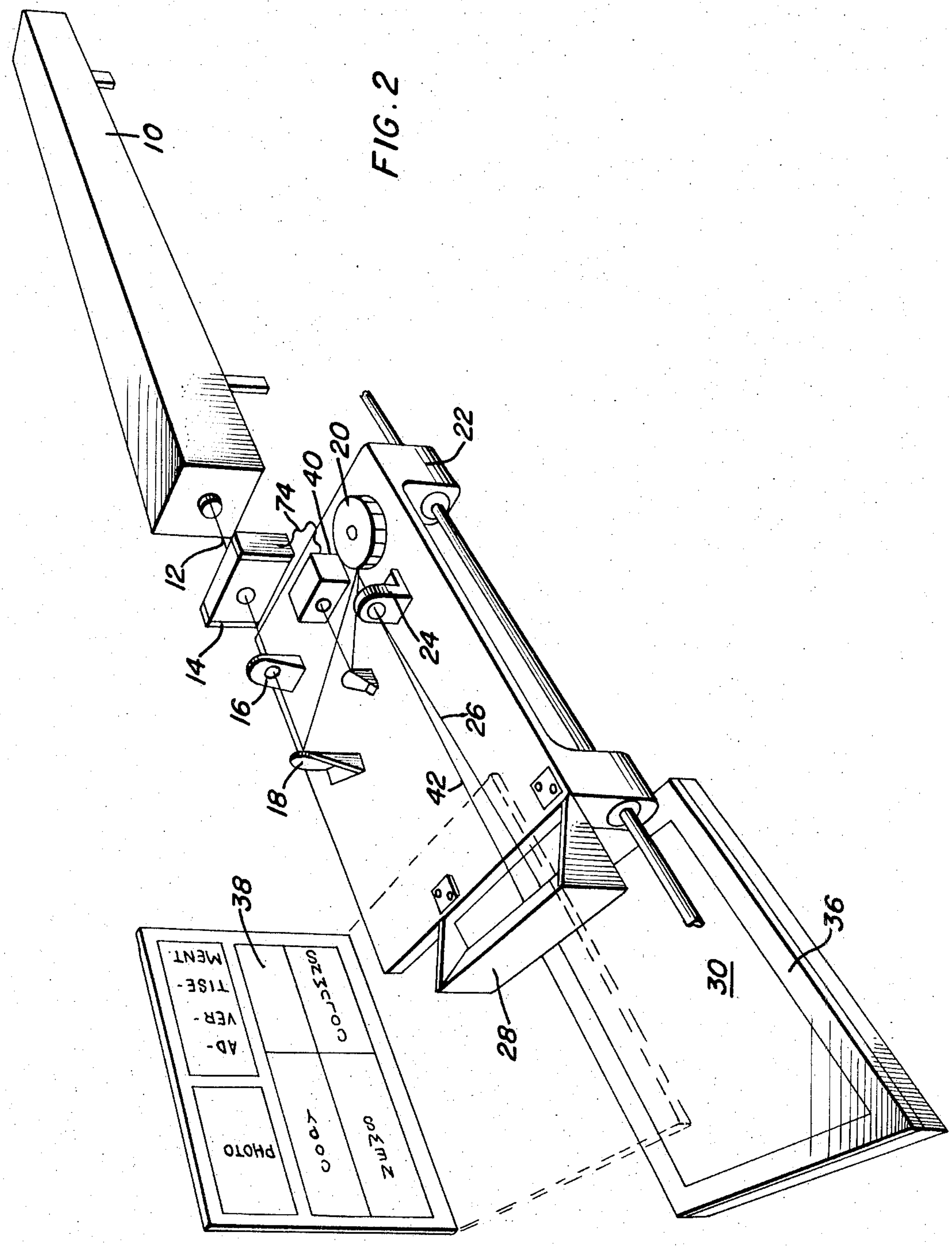
FIG. 2 illustrates a simplified view of the apparatus for forming the optical mask.

Referring to the drawings and with particular reference to FIG. 2, the number 10 designates a continuous-wave laser of the argon-ion type which is capable of selectively producing coherent light at a number of discrete wavelengths, including ultraviolet. Video electronic signals which describe the information content of each scan line of the original document are impressed onto the laser beam 12 by the laser modulator 14. The modulated laser beam is then expanded by beam expander 16 and is then reflected off a folding mirror 18 which directs the laser beam on a spinning polygon mirror 20 which causes the beam to scan lines perpendicular to the carriage transport 22.

Figure 3:
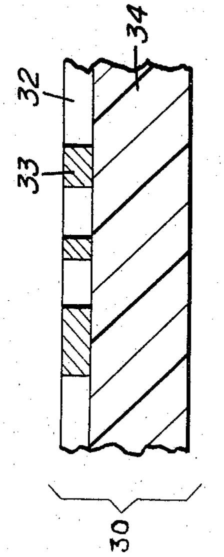
FIG. 3 is a cross-sectional view of a portion of the optical mask after exposure and heat development showing the darkened exposed image areas of the dry silver film on the U. V. transmissive substrate.

The reflected beam from mirror 20 is then focused by a flat field lens system 24. The scanned, focused and modulated recording beam 26 is then reflected off a dihedral mirror 28, which reflects the beam down onto the optical mask 30 supported on a vacuum platen 36. FIG. 3 shows the optical mask after exposure and heat treatment. Substrate 34 is coated with an essentially transparent dry silver coating 32 forming the optical mask 30. After scanning with modulated laser beam 26, and heat development, the dry silver coating is darkened in the exposed areas 33 to form an image. Substrate 34 is a material capable of transmitting U.V. radiation in the range 2,000–4,000 A, preferably a plastic. Various plastic materials are operable as the substrate including, but not limited to, polyethylene terephthalate, cellulose acetate and the like. The dry silver optical mask usually has a thickness in the range 3–5 mils. Transport of the optical carriage 22 in FIG. 2 allows the complete frame of film to be exposed and imaged.

Figure 5:
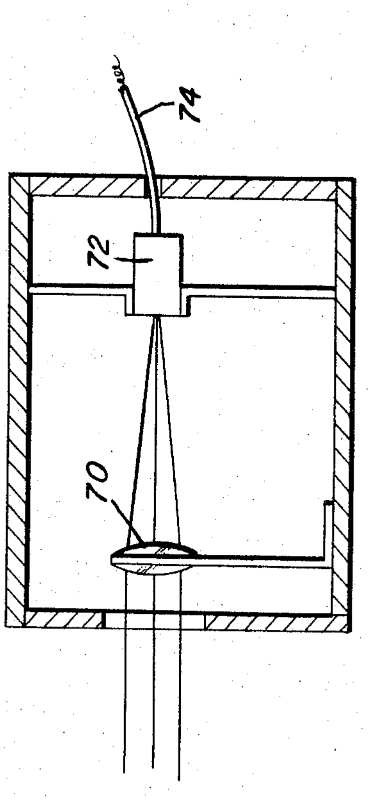
FIG. 5 is a cross-sectional view of a portion of the read system.

The video signal which drives the modulator is generated by illuminating the paste-up copy 38 normally face down with a conventional light source within the read system 40. The multifaceted mirror spinner 20, used in common with the recording beam 26 causes the illumination beam 42 to scan a line perpendicular to the direction of the optical carriage transport. Optics 70 within the read system 40 illustrated in FIG. 5 collect reflected visible light at each point over the scan length and direct the reflected light onto the window of a photomultiplier tube 72 which converts the optical signal into the video electronic signal 74 used to drive the modulator 14.

Figure 1:
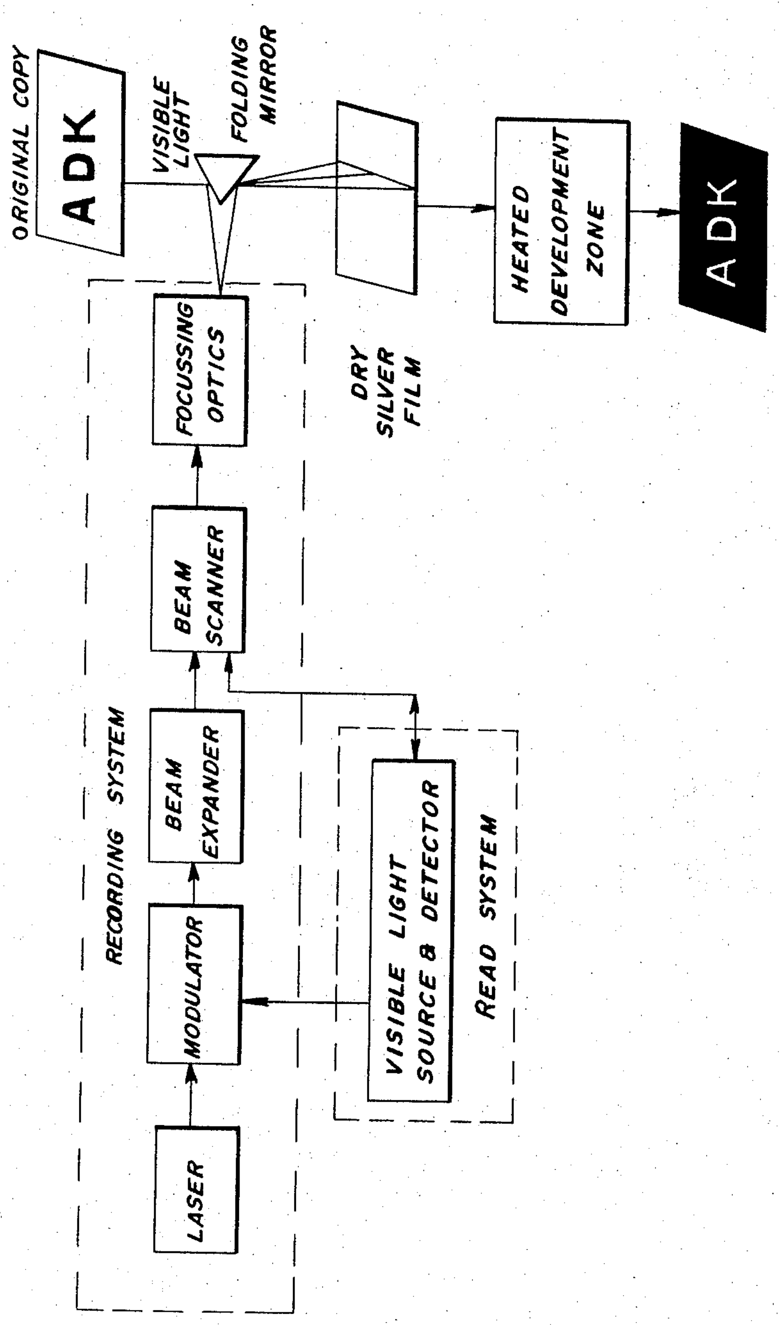
FIG. 1 is a schematic view illustrating one embodiment of the apparatus of the present invention which includes the formation of the optical mask. The optical mask thus formed is subsequently passed through a short heating step and then used to image a printing plate utilizing conventional light sources.

Following scanning of the dry silver film the film is transferred to a heated development zone as shown in FIG. 1 wherein the film is maintained at a temperature in the range 250°–270°F for a period ranging from about 10 seconds to about 2 minutes. This heat treatment develops the latent image (i.e., darkens the laser struck portion) in the dry silver film resulting in an optical mask which is ready for imaging use.

Figure 4:
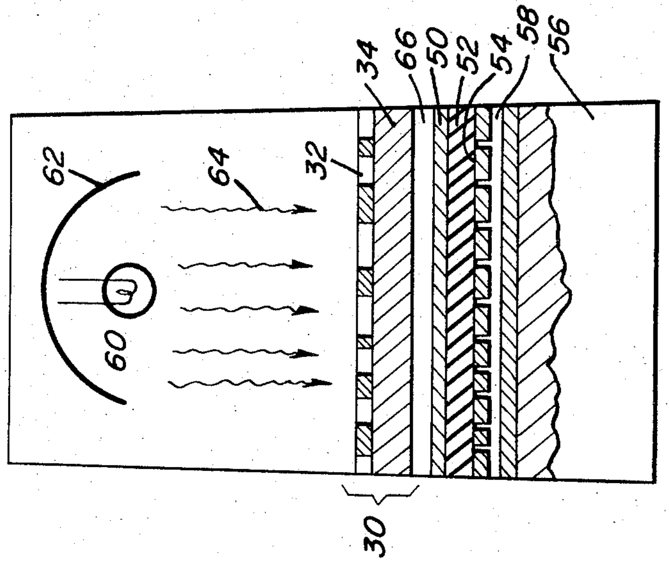
FIG. 4 is a cross-sectional side elevation view showing the exposure of a photosensitive composition to a non-coherent UV radiation source through the optical mask.

FIG. 4 shows the positioning of the thus formed laser scanned optical mask in forming a printing plate. Optical mask 30, consisting essentially of a laser scanned dry silver transparent film coating 32 with opaque areas 33 on transparent substrate 34, is positioned over a UV photosensitive composition 50 on a support layer 52 which is maintained on the surface 54 of base 56 by means of a vacuum platen 58. Photosensitive composition 50 is exposed through optical mask 30 to radiation from UV light source 60 within generally parabolic reflector 62 to obtain semi-collimated light rays 64 on the composition. In the instance where photosensitive composition 50 is a liquid, an air gap 66 is maintained by means of shims or otherwise (not shown) between optical mask 30 and photosensitive composition 50. This precludes the possibility of the mask sticking to the composition after exposure which may lead to imperfections in the exposed composition or the UV transparent substrate 34 when they are stripped apart after exposure. No air gap is necessary when the photosensitive composition is a solid. The portion of photosensitive composition 50 exposed to UV radiation is solidified or insolubilized by polymerization or curing or both depending on the composition, thereby forming a latent image. The exposure period is of relatively short duration ranging from about 1 second to about 5 minutes depending on the intensity of the light source and other factors well known to those skilled in the art. The ability to employ conventional UV light to form the latent image in the printing plate insures that the system is commercially attractive. Operable conventional UV light sources are many and varied and include, but are not limited to high and medium pressure mercury lamps, xenon arc lamps, metal halide lamps and carbon arc lamps.

Usually the UV light source radiates in a manner that the intensity of the irradiation on the surface of the photosensitive composition is in the range 400 to 40,000 microwatts/cm$^2$.

After exposure, the unexposed portion of the printing plate is removed by washing or dissolving same in a wash solution or solvent for the composition or by use of an air knife or other mechanical means. The selection of developing material, i.e., wash solution or solvent, is dependent upon the photosensitive composition utilized and such materials are well known to those skilled in the art. For example when the photosensitive composition is a polyene and polythiol as set out supra in U.S. Pat. No. 3,645,730, a spray of an aqueous detergent solution is sufficient to remove the unexposed, uncured portion of the photocurable composition. Such a development step affords the necessary relief required to form a printing plate. After washing the plate is dried and is then ready for use on conventional printing presses.

The optical mask of the instant invention imaged with the scanned and modulated laser beam can have the data input to the modulator from a paste-up, digital computer or other storage medium. Subsequent to the development of the optical mask, the mask is placed over a conventional photopolymerizable printing plate blank and exposed imagewise to a conventional actinic light source thereby producing a latent image in the plate.

The photopolymerizable material on the printing plate blank can be from various well known photopolymer systems which are now commercially available on the market. For example one system incorporated herein by reference, is that set out in U.S. Pat. No. 2,760,863 wherein the photopolymerizable layer comprises (1) an addition polymerizable ethylenically unsaturated component capable of forming a high polymer by photoinitiated polymerization in the presence of an addition polymerization initiator therefor activatable by actinic light and (2) a small amount of such an initiator said layer being super-imposed on an adherent support.

This photopolymerizable layer may be composed of any addition polymerizable monomer including mixtures of two, three or more monomers and any initiator photosensitive to actinic light either singly or in admixture with other initiators. Because of their availability and lower cost, the terminal monoethylenically unsaturated monomers, i.e., the vinylidene monomers particularly the vinyl monomers are preferred. These monomers include the vinyl carboxylates or precursors thereto. e.g., those wherein the vinyl group is in the acid portion of the molecule, such as acrylic acid and its esters, e.g., methyl acrylate, ethyl acrylate, n-butyl acrylate, acrylonitrile, methylacrylonitrile; the $\alpha$-alkyl acrylates such as methacrylic acid and ethacrylic acid and their esters such as methyl-n-propyl, n-butyl, isopropyl, and cyclophexyl meth- and ethacrylates and the like; alpha-substituted acrylic acids and esters thereof, such as ethyl $\alpha$-chloroacrylate, ethyl $\alpha$-cyanoacrylate, and the like; those vinyl components wherein the vinyl group is in the non-acid portion of the molecule, such as the vinyl esters, e.g., vinyl acetate, vinyl chloroacetate, vinyl trimethylacetate, vinyl propionate, vinyl benzoate, and the like; vinyl hydrocarbons, e.g., the vinyl aryls, such as styrene and the like; the vinylidene halides, such as vinylidene chloride. The just described monomers and mixtures of two or more monomers are liquids which boil above room temperature and should be chosen to give coherent, mechanically-strong polymeric films by bulk polymerization techniques. Of these monomers, because of their relatively high rates of photo-initiated polymerization, the vinyl aryls and/or esters or acrylic and alpha-substituted acrylic acids with solely hydrocarbon monoalcohols of no more than 6 carbons and particularly the lower alkanols of 1 to 4 carbon atoms, are preferred. Styrene and the alkyl hydrocarbon substituted acrylic acids wherein the alkyl groups contain 1 to 4 carbon atoms are particularly preferred.

Practically any initiator or catalyst of addition polymerization which is capable of initiating polymerization under the influence of actinic light can be used in the photopolymerizable layer of this invention. Because transparencies transmit both heat and light and the conventional light sources give off heat and light, the preferred catalysts or initiators of addition polymerization are not activatable thermally and preferably are soluble in the polymerizable monomer to the extent necessary for initiating the desired polymerization under the influence of the amount of light energy absorbed in the relatively short term exposures used in the process of this invention. Precautions can be taken to exclude heat rays so as to maintain the photopolymerizable layer at temperatures which are not effective in activating the initiator thermally but they are troublesome. In addition, exclusion of heat rays makes necessary longer exposure times since the rate of chain propagation in the polymerization reaction is lower at reduced temperatures. For this reason the photoinitiators most useful for this process are those which are not active thermally at temperatures below 80°–85°C. These photopolymerization initiators are used in amounts of from 0.05 to 5% and preferably from 0.1 to 2.0% based on the weight of the total photopolymerizable composition.

Suitable photopolymerization initiators or catalysts include vicinal ketaldonyl compounds such as diacetyl, benzil, etc.; α-ketaldonyl alcohols such as benzoin, pivaloin, etc.; acyloin ethers such as benzoin methyl or ethyl ethers; alpha-hydrocarbon substituted aromatic acyloins including α-methylbenzoin, α-allyibenzoin, and α-phenylbenzoin.

Most commercially available polymerizable monomers and polymers discussed previously for use in the photopolymerizable compositions normally contain minor amounts (about 50–100 parts per million by weight) of polymerization inhibitors so as to prevent spontaneous polymerization before desired. The presence of these inhibitors, which are usually of the anti-oxidant type, e.g., hydroquinone, tertiary butyl catechols and the like in such amounts causes substantially no undesirable results in the photopolymerizable layers of this invention either as to speed or quality of polymerization. In fact, larger quantities of such inhibitors, e.g., of the order of 200–500 parts per million can easily be tolerated and may be advantageous in tending to reduce unwanted polymerization in nonexposed, i.e. non-imaging, areas.

Another photosensitive material which can be exposed to actinic radiation to make a printing plate is that set out in U.S. Pat. No. 3,645,730, assigned to W. R. Grace and Co. and incorporated herein by reference. Therein the photocurable composition comprises a polyfunctional component having molecules containing at least 2 reactive ethylenically or acetylenically unsaturated carbon to carbon bonds per molecule and a polythiol component having molecules containing at least 2 thiol groups per molecule with the total functionality of the polyfunctional component and the polythiol component being greater than 4 in combination with a photocuring rate accelerator.

The crucial ingredients in this photocurable composition are:

1. about 2 to about 98 parts by weight of an ethylenically unsaturated polyene containing two or more reactive unsaturated carbon to carbon bonds;

2. about 98 to 2 parts by weight of a polythiol; and 3. about 0.0005 to about 50 parts by weight [based on 100 parts be weight of (1) and (2)] of a photocuring rate accelerator. (Preferred range of accelerator is about 0.05 to about 30 parts by weight).

The reactive carbon to carbon bonds of the polyenes are preferably located terminally, near terminally, and/or pendant from the main chain. The polythiols contain two or more thiol groups per molecule. These photocurable compositions are usually liquid at room temperatures, although the compositions can be solid, crystalline, semisolid, etc., at those temperatures, but which are liquid at 70°C.

Included in the term "liquid," as used herein, are those photocurable compositions which in the presence of inert solvent, aqueous dispersion or plasticizer have a viscosity ranging from essentially zero to 20 million centipoises at 70°C.

As used herein polyenes and polyynes refer to simple or complex species of alkenes or alkynes having a multiplicity, i.e., at least 2, "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also operable. An example of this is monovinylacetylene, which is a polyeneyen under our definition. For purposes of brevity all these classes of compounds will be referred to herein as polyenes.

As used herein the term "reactive" unsaturated carbon to carbon groups means groups which will react under proper conditions as set forth herein with thiol groups to yield the thioether linkage $$\left(-\overset{|}{\underset{|}{C}}-S-\overset{|}{\underset{|}{C}}-\right),$$

as contrasted to the term "unreactive" carbon to carbon unsaturation which means $$-\overset{|}{C}=\overset{|}{C}-$$

groups when found in aromatic nucleii (cyclic structures exemplified by benzene, pyridine, anthracene, tropolone and the like) which do not under the same conditions react with thiols to give thioether linkages. In the instant invention products from the reaction of polyenes with polythiols which contain 2 or more thiol groups per average molecule are called polythioether polymers or polythioethers.

One group of polyenes operable in the instant invention is that taught in a copending application having Ser. No. 617,801; inventors: Kehr and Wszolek, filed: Feb. 23, 1967, and assigned to the same assignee. This group includes those having a molecular weight in the range of about 50 to 20,000, a viscosity ranging from 0 to 20 million centipoises at 70°C. of the general formula $[A]\!-\!(X)_m$ wherein X is a member of the group consisting of

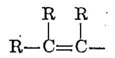

and R—C ≡ C—; *m* is at least 2; R is independently selected from the group consisting of hydrogen, halogen, aryl, substituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amounts of hetero atoms such as N, S, P or O but contains primarily carbon-carbon, carbon-oxygen or silicon-oxygen containing chain linkages without any reactive carbon to carbon unsaturation.

In this first group, the polyenes are simple or complex species of alkenes or alkynes having a multiplicity of pendant, terminally or near terminally positioned "reactive" carbon to carbon unsaturated functional groups per average molecule. As used herein for determining the position of the reactive functional carbon to carbon unsaturation, the term "terminal" means that said functional unsaturation is at an end of the main chain in the molecule; whereas by "near terminal" is meant that the functional unsaturation is not more than 16 carbon atoms away from an end of the main chain in the molecule. The term "pendent" means that the reactive carbon to carbon unsaturation is located terminally or near terminally in a branch of the main chain as contrasted to a position at or near the ends of the main chain. For purposes of brevity all of these positions will be referred to generally as "terminal" unsaturation.

The liquid polyenes operable in this first group contain one or more of the following types of non-aromatic and non-conjugated "reactive" carbon to carbon unsaturation:

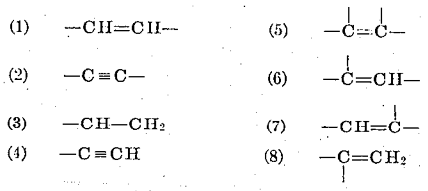

These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to non-reactive species such as

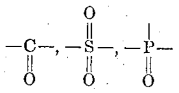

and the like so as to form a conjugated system of unsaturated bonds exemplified by the following structure:

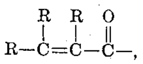

etc. On the average the polyenes must contain 2 or more "reactive" unsaturated carbon to carbon bonds/molecule and have a viscosity in the range from slightly above 0 to about 20 million centipoises at 70°C. Included in the term "polyenes" as used herein are those materials which in the presence of an inert solvent, aqueous dispersion or plasticizer fall within the viscosity range set out above at 70°C. Operable polyenes in the instant invention have molecular weights in the range of about 50 to about 20,000, preferably about 500 to about 10,000.

Examples of operable polyenes from this first group include, but are not limited to:

1. crotyl-terminated polyurethanes which contain two "reactive" double bonds per average molecule in a near terminal position of the average general formula:

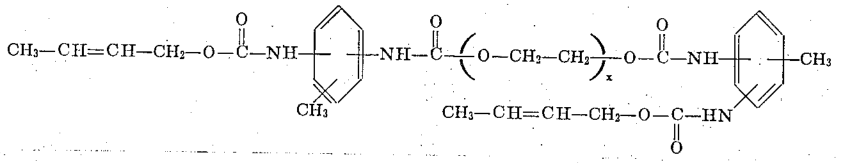

wherein *x* is at least 1, 2. ethylene/propylene/non-conjugated diene terpolymers, such as "Nordel 1040" manufactured by E. I. Dupont De Nemours and Co., Inc., which contains pendant "reactive" double bonds of the formula: $—CH_2—CH=CH—CH_3$, 3. The following structure which contains terminal "reactive" double bonds:

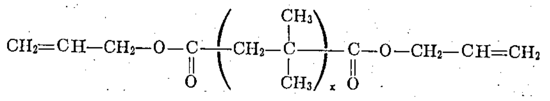

where *x* is at least 1.

4. The following structure which contains near terminal "reactive" double bonds $$CH_3(CH_2)_7-CH=CH-\left(CH_2\right)_7-\overset{O}{\overset{\|}{C}}-\left(OC_3H_6\right)_x-O-\overset{O}{\overset{\|}{C}}-\left(CH_2\right)_7-CH=CH-\left(CH_2\right)_7CH_3$$

where $x$ is at least 1.

Another group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyam des, and polyurethanes derived from monomers containing "reactive" unsaturation, e.g., adipic acid-butenediol, 1,6-hexanediamine-fumaric acid and 2,4-tolylene diisocyanate-butenediol condensation polymers and the like.

A third group of polyenes operable in this invention include those polyenes in which the reactive unsaturated carbon to carbon bonds are conjugated with adjacent unsaturated groupings. Examples of operable conjugated reactive ene systems include but are not limited to the following:

$$-\overset{|}{C}=\overset{|}{C}-\overset{O}{\overset{\|}{C}}- \quad -\overset{|}{C}=\overset{|}{C}-\underset{O}{\underset{\|}{\overset{O}{\overset{\|}{S}}}}- \text{ and } -\overset{|}{C}=\overset{|}{C}-\underset{|}{\overset{O}{\overset{\|}{P}}}-$$

A few typical examples of polymeric polyenes which contain conjugated reactive double bond groupings such as those described above are poly (oxyethylene) glycol (600 M.W.) diacrylate, poly (oxytetramethylene) glycol (1,000 M.W.) dimethacrylate, the triacrylate of the reaction product of trimethylol propane with 20 moles of ethylene oxide, and the like.

Methods of preparing various polyenes useful within the scope of this invention are disclosed in a copending application having Ser. No. 674,773 filed: Oct. 12, 1967, now abandoned, and assigned to the same assignee. Some of the useful polyenes are prepared in the detailed examples, set forth in the following specification.

As used herein, the term polythiols refers to simple or complex organic compounds having a multiplicity of pendant or terminally positioned —SH functional groups per average molecule.

On the average the polythiols must contain 2 or more —SH groups/molecule. They usually have a viscosity range of slightly above 0 to about 20 million centipoises (cps) at 70°C., as measured by a Brookfield Viscometer. Included in the term "polythiols" as used herein are those materials which in the presence of an inert solvent, aqueous dispersion or plasticizer fall within the viscosity range set out above at 70°C. Operable polythiols in the instant invention usually have molecular weights in the range about 50 to about 20,000 or more, preferably about 100 to about 10,000.

The polythiols operable in the instant invention can be exemplified by the general formula: $R_8\text{—}(SH)_n$ where $n$ is at least 2 and $R_8$ is a polyvalent organic moiety free from "reactive" carbon to carbon unsaturation. Thus $R_8$ may contain cyclic groupings and minor amounts or hetero atoms such as N, S, P or O but primarily contains carbon-hydrogen, carbon-oxygen, or silicon-oxygen containing chain linkages free of any "reactive" carbon to carbon unsaturation.

One class of polythiols operable with polyenes in the instant invention to obtain essentially odorless cured polythioether printing plates are esters or thiol-containing acids of the general formula: $HS—R_9—COOH$ where $R_9$ is an organic moiety containing no "reactive" carbon to carbon unsaturation with polyhydroxy compounds of the general structure: $R_{10}\text{—}(OH)_n$ where $R_{10}$ is an organic moiety containing no "reactive" carbon to carbon unsaturation and $n$ is 2 or greater. These components will react under suitable conditions to give a polythiol having the general structure:

$$R_{10}-\left(O\overset{O}{\overset{\|}{C}}-R_9-SH\right)_n$$

where $R_9$ and $R_{10}$ are organic moieties containing no "reactive" carbon to carbon unsaturation and $n$ is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid ($HS—CH_2COOH$), α-mercaptopropionic acid ($HS—CH(CH_3)—COOH$ and β-mercaptopropionic acid ($HS—CH_2CH_2COOH$) with polyhydroxy compounds such as glycols, triols, tetraols, pentaols, hexaols, etc. Specific examples of the preferred polythiols include but are not limited to ethylene glycol bis (thioglycolate), ethylene glycol bis (β-mercaptopropionate), trimethylolpropane tris(thioglycolate), trimethylolpropane tris (β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis (β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, and after reaction, give essentially odorless cured polythioether end products which are commercially useful resins or elastomers for printing plates.

The above patents showing operable photosensitive compositions are incorporated herein by reference.

Lasers operable in forming the optical mask in the instant invention are many and varied. Any laser which emits in the wavelength range of 3,000–8,000 A is effectual. Various types of operable lasers include, but are not limited to, solid state lasers such as YAG lasers; gas lasers such as xenon, argon, krypton, He/Cd, neon etc. and tuneable dye lasers.

EXAMPLE I

A sheet of high contrast silver film commercially available from 3M Company as Type 7869 Dry Silver Film, was irradiated with a scanned and modulated laser beam, while the film was held stationary on a vacuum platen. The laser was a Nd/YAG laser (GTE Sylvania Model Mini-YAG) emitting 1 watt continuous wave at 1.06 microns in the $TEM_{00}$ mode. A flat field lens system with a net transmittance of 85%, focused the beam down to 50 microns in diameter, and maintained a flat focal plane across the scan width. Line scans were generated by a twelve-sided polygon mirror rotating at 700 revolutions per minute. Video information both line and half-tone was impressed onto the laser beam by an acousto-optic modulator (Zenith Model D 15OR) having an optical efficiency of 50%. A full size 9 ½ inch × 9 ½ inch latent optical mask was generated by scanning 5,800 lines within a period of 20 seconds. The scanned dry silver film was transferred to a heated development zone, i.e. a 3M Company Model 199 Dry Developer wherein it was heated at 255°F for 1 minute. The thus developed optical mask had an ultraviolet transmittance in the opaque areas of less than 1% while UV transmittance of the transparent areas of the optical mask was in excess of 85%. The optical mask was set aside for subsequent use for forming a printing plate hereinafter.

458 g. (0.23 moles) of a commercially available liquid polymeric diisccyanate sold under the tradename "Adiprene L-100" by E. I. dupont de Nemours and Co. was charged to a dry resin kettle maintained under a nitrogen atmosphere and equipped with a condenser, stirrer, thermometer, and gas inlet and outlet. 37.8 g. (0.65 moles) of allyl alcohol was charged to the kettle and the reaction was continued for 17 hours with stirring at 100°C. Thereafter the nitrogen atmosphere was removed and the kettle was evacuated 8 hours at 100°C. 50 cc. dry benzene was added to the kettle and the reaction product was azeotroped with benzene to remove the unreacted alcohol. This allyl terminated liquid prepolymer had a molecular weight of approximately 2,100 and will be referred to as Prepolymer A hereinafter.

484 grams of Prepolymer A was admixed with 56 grams (0.115 moles) of pentaerythritol tetrakis (β-mercaptopropionate) commercially available from Carlisle Chemical Company under the tradename "Q-43" and 5 grams of benzophenone. This photocurable composition was coated on an aluminum substrate to a thickness of 20 mils.

The optical mask was then located over said photocurable composition on the aluminum substrate with an air gap of 10 mils maintained between the bottom of the optical mask and the top surface of the photocurable composition. A conventional 8,000 watt Ascorlux pulsed xenon arc lamp having its major spectral lines all above 3,000 A and located 63 inches above the surface of the photocurable composition was used to irradiated the composition for one minute. This caused the portions of the photocurable composition exposed through the optical mask to harden and cure while the unexposed portions remained liquid and uncured. The printing plate was developed by immersing it in an ultrasonic bath maintained at 60°C containing an aqueous detergent solution which removed the uncured, unexposed portion of the photocurable composition in 2 minutes. The resulting plate showed clear legible type of 20 mil thickness on the aluminum substrate. The plate was mounted on a Goss letterpress and the resulting print showed very sharp definition of the images.

EXAMPLE II

Example I was repeated except that the aluminum substrate was grained and anodized and the thickness of the photocurable composition was 0.05 mils. The resulting lithographic printing plate was mounted on a Harris Cottrell M-1000 lithographic press and the resulting print showed very sharp and clear definition of the image.

In combination with the polyene/polythiol photocurable composition, various photocuring rate accelerators are operable and well known to those skilled in the art. Examples include, but are not limited to, benzophenone, acetophenone, acenapthene-quinone, methyl ethyl ketone, valerophenone, hexanophenone, γ-phenylbutyrophenone, p-morpholinopropiophenone, dibenzosuberone, 4-morpholinobenzophenone, 4-morpholinodeoxybenzoin, p-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3-acetylphenanthrene, 3-acetylindole, 9-fluorenone 1-indanone, 1,3,5-triacetylbenzene, thioxanthen-9-one, xanthene-9-one, 7-H-benz-[de]anthracen-7-one, 1-naphthaldehyde, 4,4'-bis(dimethylamino) benzophenone, fluorene-9-one, 1'-acetonaphthone, 2'-acetonaphthone and 2,3-butanedione, etc. which serve to give greatly reduced exposure times and thereby when used in conjunction with ultra-violet radiation yield very rapid, commercially practical time cycles for forming printing plates. The curing rate accelerators are usually added in an amount ranging from 0.0005 to 50% by weight based on the weight of the polyene/-polythiol.

What is claimed is:

1. A process for making a photopolymer plate which comprises:

generating a latent image on an optical mask surface by scanning the mask surface with a focussed beam of modulated coherent radiation having a wavelength of about 3,000 A to 8,000 A, said optical mask consisting essentially of a U-V transmissive substrate having coated thereon a photographic emulsion containing silver halide and chemical developing material separated by a heat-releasing encapsulant, to expose the photographic emulsion with said radiation;

thermally developing the latent image on the optical mask by heating the optical mask; and exposing a photocurable liquid layer on a plate substrate imagewise through said optical mask with U-V light having a wavelength of about 2,000 A to 4,000 A to produce a polymer relief surface corresponding to the developed image.

2. The process according to claim 1 wherein the photosensitive composition consists essentially of (1) a polyene containing at least 2 reactive unsaturated carbon to carbon bonds per molecule, (2) a polythiol containing at least two thiol groups per molecule, the total combined functionality of (a) the reactive unsaturated carbon to carbon bonds per molecule in the polyene and (b) the thiol groups per molecule in the polythiol being greater than 4, and (3) 0.0005 to about 50 parts by weight based on the weight of said polyene and said polythiol of a photocuring rate accelerator.

* * * * *